United States Patent
De Ranter et al.

(10) Patent No.: US 7,224,235 B2
(45) Date of Patent: May 29, 2007

(54) PHASE-ACCURATE MULTI-PHASE WIDE-BAND RADIO FREQUENCY LOCAL OSCILLATOR GENERATOR

(75) Inventors: Carl De Ranter, San Diego, CA (US); Peter Jivan Shah, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 58 days.

(21) Appl. No.: 11/219,980

(22) Filed: Sep. 6, 2005

(65) Prior Publication Data

US 2006/0135108 A1    Jun. 22, 2006

Related U.S. Application Data

(60) Provisional application No. 60/636,584, filed on Dec. 16, 2004.

(51) Int. Cl.
*H03L 7/00* (2006.01)

(52) U.S. Cl. .................. 331/34; 331/74; 455/313; 455/318; 455/323

(58) Field of Classification Search .................. 331/74, 331/34; 455/313, 318, 323
See application file for complete search history.

(56) References Cited

U.S. PATENT DOCUMENTS 6,243,567 B1 *  6/2001  Saito ........................ 455/188.2

* cited by examiner

*Primary Examiner*—Arnold Kinkead
(74) *Attorney, Agent, or Firm*—Michael W. Landry

(57) ABSTRACT

A local oscillator (LO) generator for driving a bank of mixers that provides precise phase relationship between multi-phase LO outputs comprises a shift register using slave-master-slave flip-flop elements. The LO generator can be used over a wide operating frequency range. The LO generator is suitable for driving a multi-phase LO clock input to a harmonic suppression mixer. A pattern generator produces a pattern signal and a reclocking signal that determines the frequency of the LO signals and the phase delay between the LO output phases.

4 Claims, 5 Drawing Sheets

PHASE-ACCURATE MULTI-PHASE WIDE-BAND RADIO FREQUENCY LOCAL OSCILLATOR GENERATOR

RELATED APPLICATIONS

This application claims priority from U.S. provisional application No. 60/636,584 filed Dec. 16, 2004 entitled "Phase-accurate multi-phase wide-band Radio Frequency Local Oscillator generator", incorporated herein by reference.

U.S. patent application Ser. No. 11/078,050, filed Mar. 11, 2005 entitled "Harmonic suppression mixer and tuner", incorporated herein by reference.

BACKGROUND

1. Field of the Invention

The present invention relates to radio frequency local oscillator generators used with multiple-mixer tuners.

2. Prior Art

Superheterodyne receivers use one or more local oscillators (LO) to convert an input frequency to an intermediate frequency before the signal is demodulated. In an ideal receiver, these frequency conversions would not distort the input signal and all the information in the input signal would be recovered. In actual application, the local oscillator can add distortions that can limit the receiver's ability to recover the signal information. The principle local oscillator degradation is random phase variations known as phase noise.

The ideal local oscillator (LO) generator for implementing multiple output phases for use in applications such as the commonly assigned U.S. patent application Ser. No. 11/078,050, filed Mar. 11, 2005 entitled "Harmonic suppression mixer and tuner", incorporated herein by reference, must have low phase noise and there must be a minimum phase mismatch between the multiple outputs. Ideally, the LO generator would use minimum chip area and minimum power.

The minimized phase mismatch between the multiple outputs is required in many applications because of the need for high image rejection and high harmonic rejection in the mixing and tuning process. Multiple frequency division ratios are also needed to provide frequency agility in the tuner.

U.S. Pat. No. 6,856,208, issued to Lee et al. on Feb. 15, 2005, entitled "Multi-phase Oscillator and Multi-phase Oscillation Signal Generation Method", incorporated herein by reference, describes a multi-phase oscillator that can be a single phase oscillator, a 180 degree phase difference oscillator or a multiple phase difference oscillator.

In applications such as multi-mixer tuners, described in co-pending U.S. patent application Ser. No. 11/078,050, filed Mar. 11, 2005 entitled "Harmonic suppression mixer and tuner", multiple frequency division ratios are needed in order to generate a wide range of LO output frequencies from a limited input clock frequency range.

The multi-mixer architecture needs multiple LO clock phases to actively reject higher harmonics of the LO clock signal. To do this with high suppression ratios, the low phase mismatch requirement is of the utmost importance.

To reduce overall cost, chip area must be kept as low as possible; furthermore, a more compact layout will result in a lower uncertainty on phase accuracy.

FIG. 1 shows a solution known in the prior art. The slave latch not only provides the LO signal to the mixer, but is also loaded by the master latch in the next flip-flop. This results in a deterioration of the signal slope and phase accuracy. To minimize the deterioration due to capacitive and other loading, an emitter follower or source follower can be included at the output of the slave latch or the bias current of the latch can be increased.

The master input of flip-flop 2 in FIG. 1 is directly connected to the output of flip-flop 1. Any feed-through of the master clock to the input of the master latch of flip-flop 2, results in a ripple on the LO signal going to the mixer. This can result in LO feed-through and down conversion of unwanted RF signals at harmonics of the LO signal. Both effects directly lead to deteriorated harmonic rejection performance of the mixer architecture referred to above.

The propagation delay from the slave output of flip-flop 1 to the master input of flip-flop 2 has to be low enough to meet the setup-time requirement of the slave latch at high frequencies. If this requirement is not met, the phase accuracy of the output signal is deteriorated considerably. The optional emitter/source follower included to solve the load-related issue described above adds additional delay. This delay can be minimized by increasing its bias current, but results in increased circuit power consumption.

The physical layout of the circuit as shown in FIG. 1 poses considerable challenges that need to be solved in order to avoid adverse effects on the performance. Clock lines and slave output lines can couple resulting in unwanted clock feed-through. Additionally, the connection between slave output and master input needs to be kept short to avoid extra loading due to parasitics. The interconnection scheme used at the slave output may be complicated and therefore, layout asymmetry will be unavoidable. If a differential signaling implementation is used, this asymmetry will have a negative influence on the final phase accuracy.

Even by substantially increasing current consumption, not all of these issues can be solved.

FIG. 2 shows another prior art solution where the input of flip-flop 2 is driven with the master latch output of flip-flop 1. This requires the clock signals of flip-flop 1 and flip-flop 2 to be inverted with respect to each other to avoid digital race conditions. For example, flip-flop 1 would be clocked at the rising edge and flip-flop 2 would be clocked at the falling edge of the clock signal. In fact, using the master of flip-flop 1 as a reference, the input latch of flip-flop 2 then can be considered a slave latch since it is clocked on the same clock edge as the slave of flip-flop 1.

A major negative side effect of this clocking scheme is that the resulting output signal phase accuracy becomes dependent on the duty cycle of the clock signal. Furthermore, the propagation delay of the master latch will increase due to increased loading. This can be alleviated but requires increasing the master latch bias current or adding an emitter or source follower.

SUMMARY OF INVENTION

The present invention generates a multi-phase local oscillator (LO) signal with a clocked shift register that uses a slave-master-slave flip-flop configuration in each stage of the shift register. The shift register is driven by a reclocking signal produced by a programmable divider. This divider-pattern generator produces an input signal of a particular phase and frequency to the first stage of the shift register. The input slave latch of each stage accepts a data signal, the slave latch is coupled to a master latch that is clocked on an alternate edge of the reclocking signal, then coupled to an output slave latch. The LO phase signal at each stage is output from the output slave latch. The output of the intermediate master latch of a succeeding register stage is used to drive the input of the input slave latch in the following register stage. By coupling the intermediate latch output to the next stage, loading of the LO output is avoided.

In order to reduce the phase mismatch between the clock signals, the output slave latch of all stages is used to align the LO signals in phase. The number of shift register stages used is equal to the highest number of required LO phases.

The flip-flops are arranged in a shift register fashion. Thus, a flip-flop output provides a signal to the mixer circuit and also drives the input of the next flip-flop. To avoid deterioration of the signal going to the mixer circuit, especially degrading the slope of the signal, the output driving the next flip-flop is taken from the master latch inside the slave-master-slave flip-flop circuit.

In order to avoid digital race conditions when driving a flip-flop input from a master latch coming from a previous flip-flop while keeping the output phase accuracy independent of the clock duty cycle, each flip-flop is given an additional slave latch at the input of the flip-flop. This additional slave latch then drives the following master-slave section of the flip-flop.

The input signal to the first flip-flop in the shift register and the clock signal are set up to provide the wanted combination of the final output frequency and the number of different phases to the mixer circuit as LO signal.

The present invention local oscillator is suitable for use with a multi-mixer harmonic suppression mixer and tuner. The digital LO signals drive switching mixers of the tuner.

DETAILED DESCRIPTION OF THE INVENTION

Figure 1:
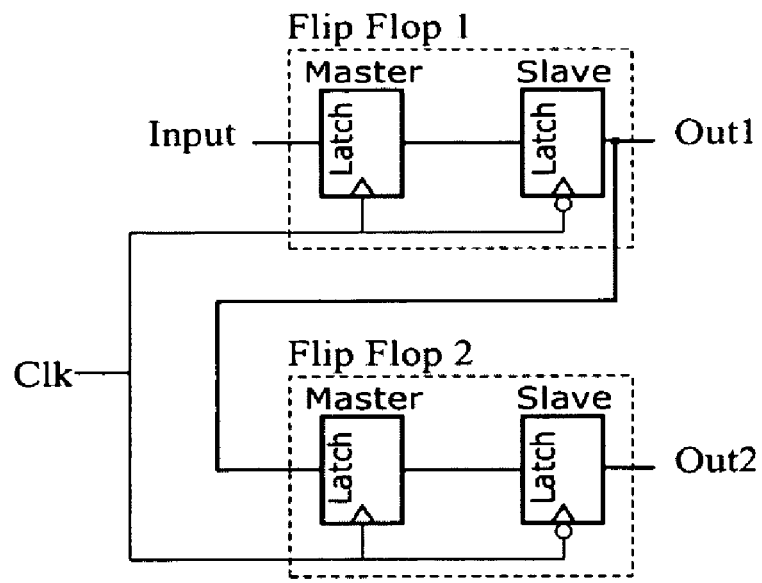
FIG. 1 shows a prior art shift register interconnection.
Figure 2:
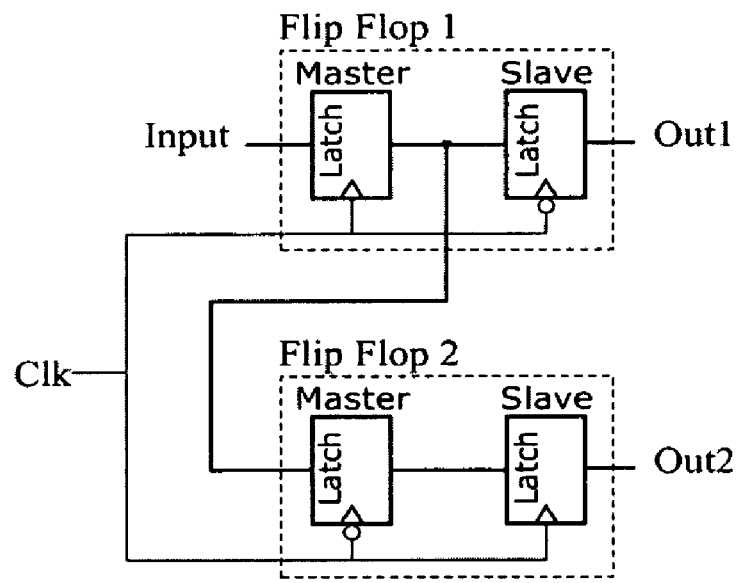
FIG. 2 shows an alternative prior art shift register interconnection.
Figure 3:
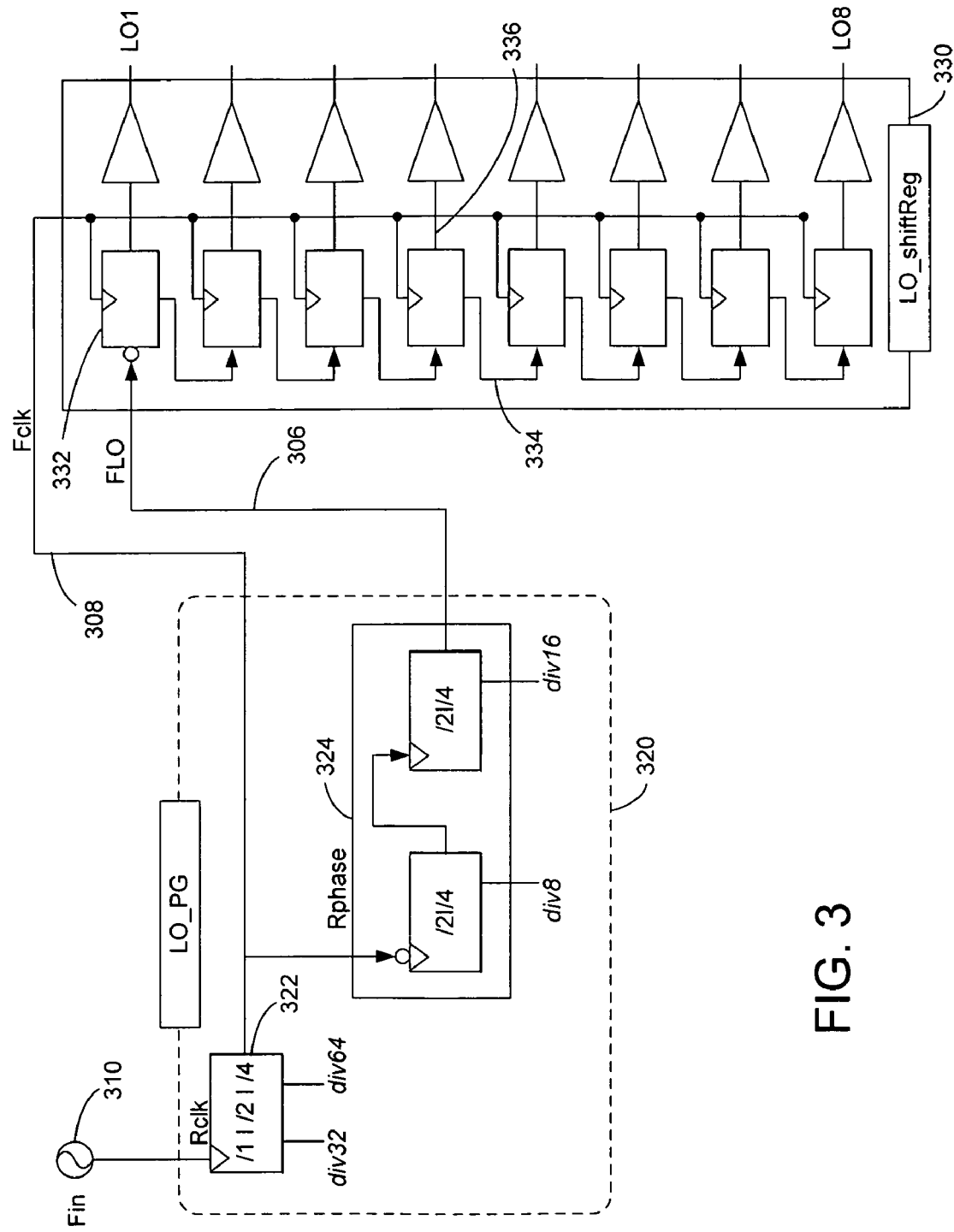
FIG. 3 shows a multi-phase LO generator with clock divider, pattern generator, and shift register according to the present invention.

FIG. 3 shows a detailed block diagram of a multi-phase LO generator consisting of a pattern generator 320 and a reclocking shift register 330. The pattern generator 320 provides the input signal 306 to the first flip-flop 332 of the shift register 330. Each flip-flop in the shift register is identical and the detail of the flip-flop is described below. The pattern generator 320 additionally divides the input frequency (Fin) 310 by programmable divider 322 to supply the reclocking signal 308 to the clock input of all the flip-flops in the shift register 330. Different types of flip-flops can be used, but in this embodiment and as an example, D-type flip-flops are used. The flip-flops herein will be referred to as "DFF". The flip-flops have a slave-master-slave configuration with the master latch and the second slave latch providing outputs. In this embodiment, a shift register with 8 flip-flops is described. Other embodiments could vary in the number of flip-flops used in the shift register, in the presence or absence of the pattern generator circuit or in the topology of the pattern generator circuit, and in type of circuit to realize the flip-flop functionality.

In the pattern generator circuit 320, the input frequency 310 (Fin) is divided down to the desired LO frequency 306 by two-stage divider 324. This signal is reclocked at frequency 308 by the eight flip-flop shift register. To describe the functionality, three frequency division ratios are considered:

Rclk is the frequency division ratio of the input frequency 310 (Fin) and the reclocking frequency 308 (Fclk), where Rclk=1, 2 or 4.

Rphase is the frequency division ratio of the reclocking frequency 308 (Fclk) and the input frequency 306 (FLO) of the first DFF, where Rphase=4, 8 or 16.

Rdiv is the total frequency division ratio of the input frequency 310 (Fin) and the LO frequency 306 (FLO). It is equal to Rphase*Rclk, which results in Rdiv=4, 8, 16, 32 or 64.

TABLE 1

Relationship between phases and division ratios

| Division ratios | | | Number of phases |
|---|---|---|---|
| Rclk | Rphase | Rdiv | (nφ) (Modes) |
| 1 | 4 | 4 | 2 |
| 1 | 8 | 8 | 4 |
| 1 | 16 | 16 | 8 |
| 2 | 16 | 32 | 8 |
| 4 | 16 | 64 | 8 |

The division ratio Rphase sets the number of output phases of the LO generator. Using division ratios of 4 up to 16, the output of the shift register bank will provide two, four or eight different phases. An overview of the different modes is given in Table 1. The number of phases is not dependent on the value of Rclk, since both input signal and reclocking signal are divided by this ratio. For values of Rdiv higher than sixteen, the input frequency is divided down by a factor Rclk before splitting the signal between the flip-flop input path and the reclocking path. The modes with division ratios of 32 and 64 therefore still have a resolution of $\pi/8$ (1/16th of a period), resulting in eight phases at the output of the shift register.

Output 334 (the master latch output) of each flip-flop is used as input for the next flip-flop. In order to avoid extra, and possibly asymmetric, loading on the sensitive slave output 336, an extra latch clocked on the slave clock phase is inserted as the input stage of each DFF, and the output to drive the next stage is taken from the master latch of the previous DFF. To minimize the loading effect on the master latch, an emitter follower or source follower is used to drive the two slaves.

In this description, the circuit referred to as "flip-flop" could be any circuit that realizes the following basic functionality with all signals considered "digital" (either high or low):

The circuit has a signal input and a clock input, and a signal output;

During clock phase 1 the signal input has no direct influence on the output signal and the output signal is held at its previous value (hold phase);

Only during clock phase 2, the output is allowed to change so its value at the end of phase 2 is identical to the input value at the end of the preceding clock phase 1.

Figure 4:
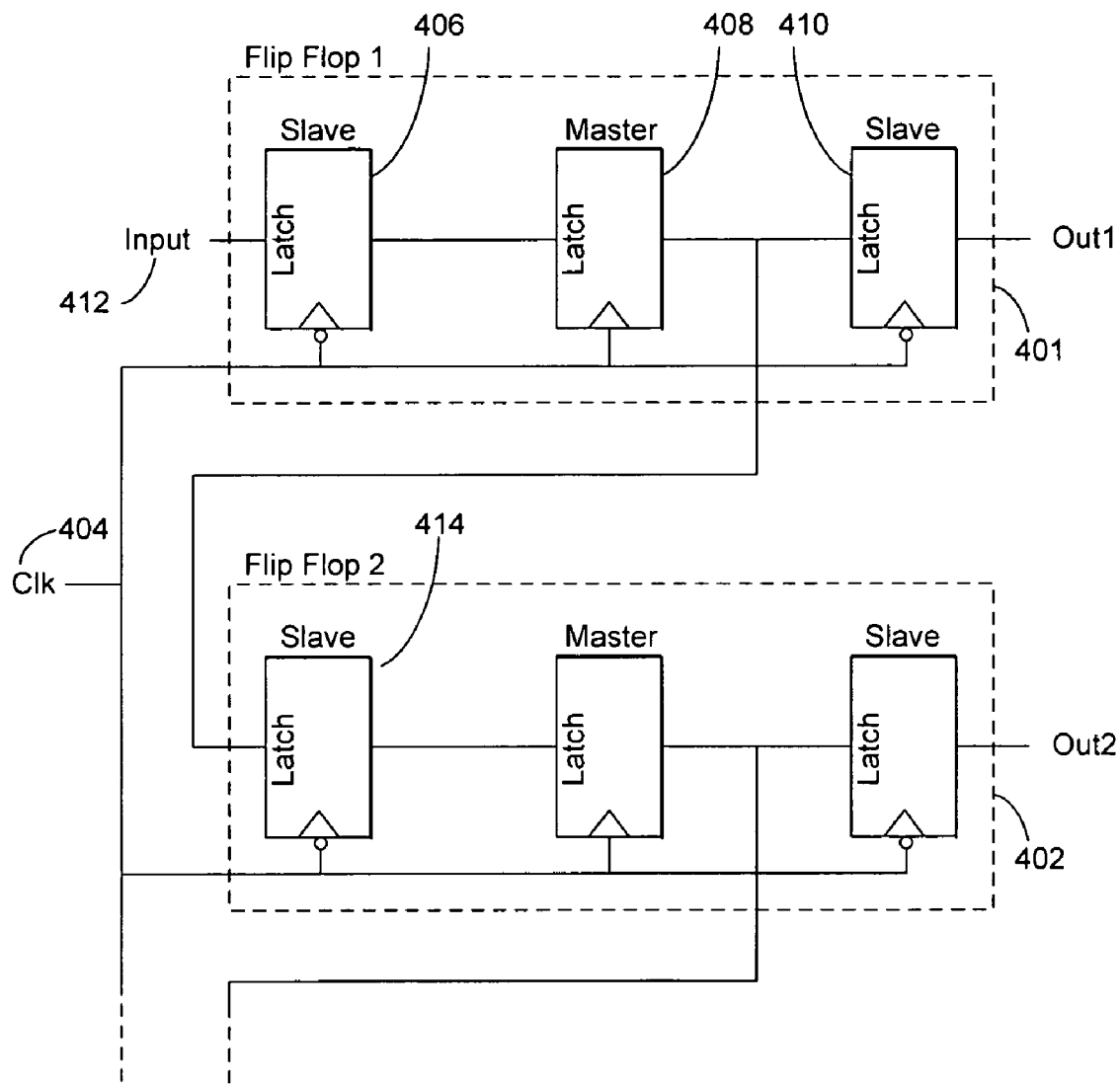
FIG. 4 shows a slave-master-slave flip-flop interconnection according to the present invention.

FIG. 4 shows the details of the shift register flip-flops, using slave-master-slave configuration, and the interconnection of two consecutive flip-flops 401 and 402 each having two slave latches. Master and slave latches are active or triggered on opposite phases or phase edges of the clock signal 404 (Clk). Clk 404 is driven by Fclk 308 in FIG. 3. Slave latch 406 at the input of each flip-flop drives the master latch 408 inside the same flip-flop. Master latch 408 drives the second slave latch 410 inside the same flip-flop and also the first slave latch 414 of the following flip-flop 402 in the shift register. The total number of flip-flops interconnected in this way is set by the number of desired output signals. Signal 412 is the input signal of the first flip-flop in the shift register. Using this kind of interconnection, the output slave is not loaded by the next flip-flop and edge transitions can be faster and better defined in time and feed-through of the master clock to the slave output is avoided. Out1 and Out2 are examples of LO phases that drive a mixer bank.

The connection of the clock line 404 limits the ratio of the re-clock frequency and the LO frequency (Fclk/FLO) to a minimum of 4. In this clocking scheme, the output signal phase accuracy is not sensitive to the duty cycle of the clock signal.

Using an alternative clocking scheme, the minimum ratio of Fclk/FLO can be decreased to 2. More specifically this can be done by using both phases or edges of the clocking signal. For example, all odd numbered flip-flops would be clocked at the positive phase or rising clock edge and all even numbered flip-flops would be clocked at the negative phase or falling edge. The edge or phase that clocks the master latch is considered the edge or phase that clocks the flip-flop. Other configurations could also be used to realize the same minimum ratio of Fclk/FLO. This alternative clocking scheme is sensitive to duty cycle.

Figure 5:
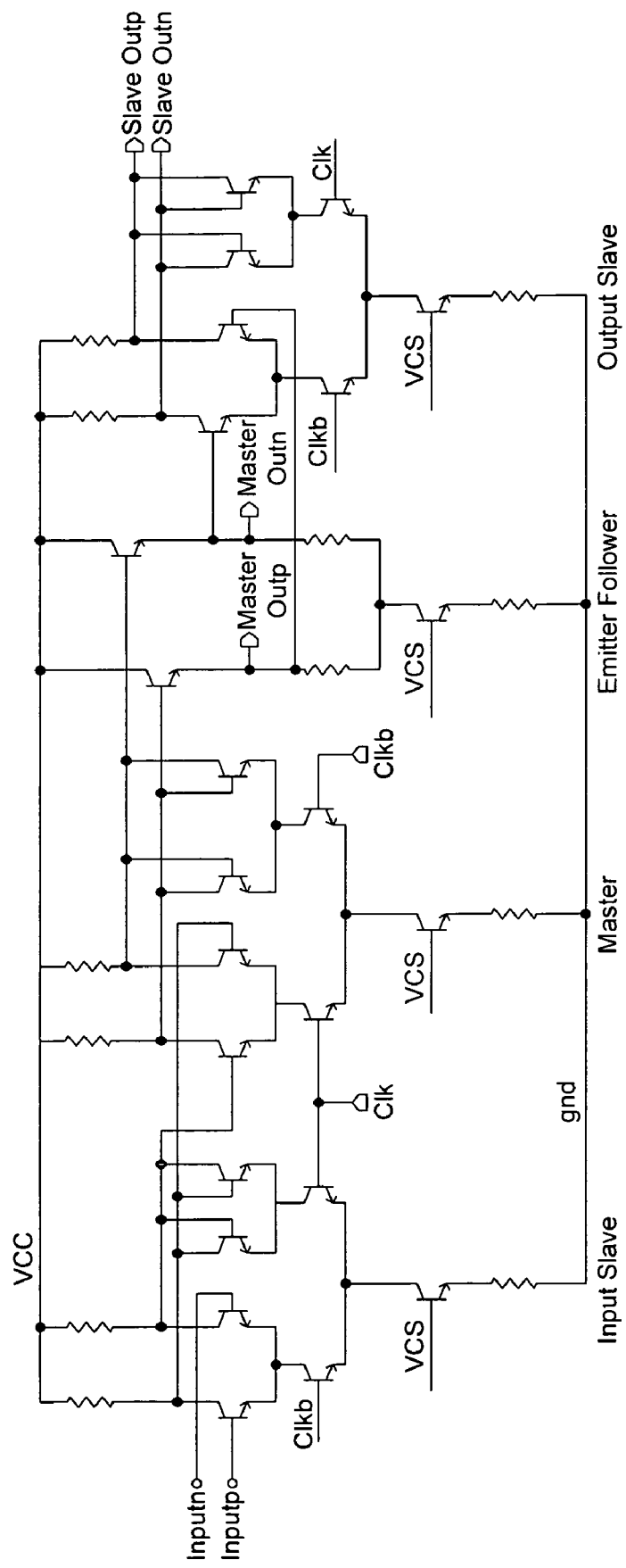
FIG. 5 shows an exemplary ECL transistor schematic of edge-triggered slave-master-slave D-flip-flop for use with the present invention.

FIG. 5 shows an example of a detailed implementation of an edge-triggered double-slave flip-flop using emitter coupled logic (ECL). Other implementations could differ in the type of event that triggers the flip-flop (clock edge, clock level, etc), in the type of technology used (bipolar, BiCMOS, CMOS, GAS, etc.), or in the type of logic or in any detail of the used circuit topology to realize the double-slave flip-flop functionality.

Figure 6:
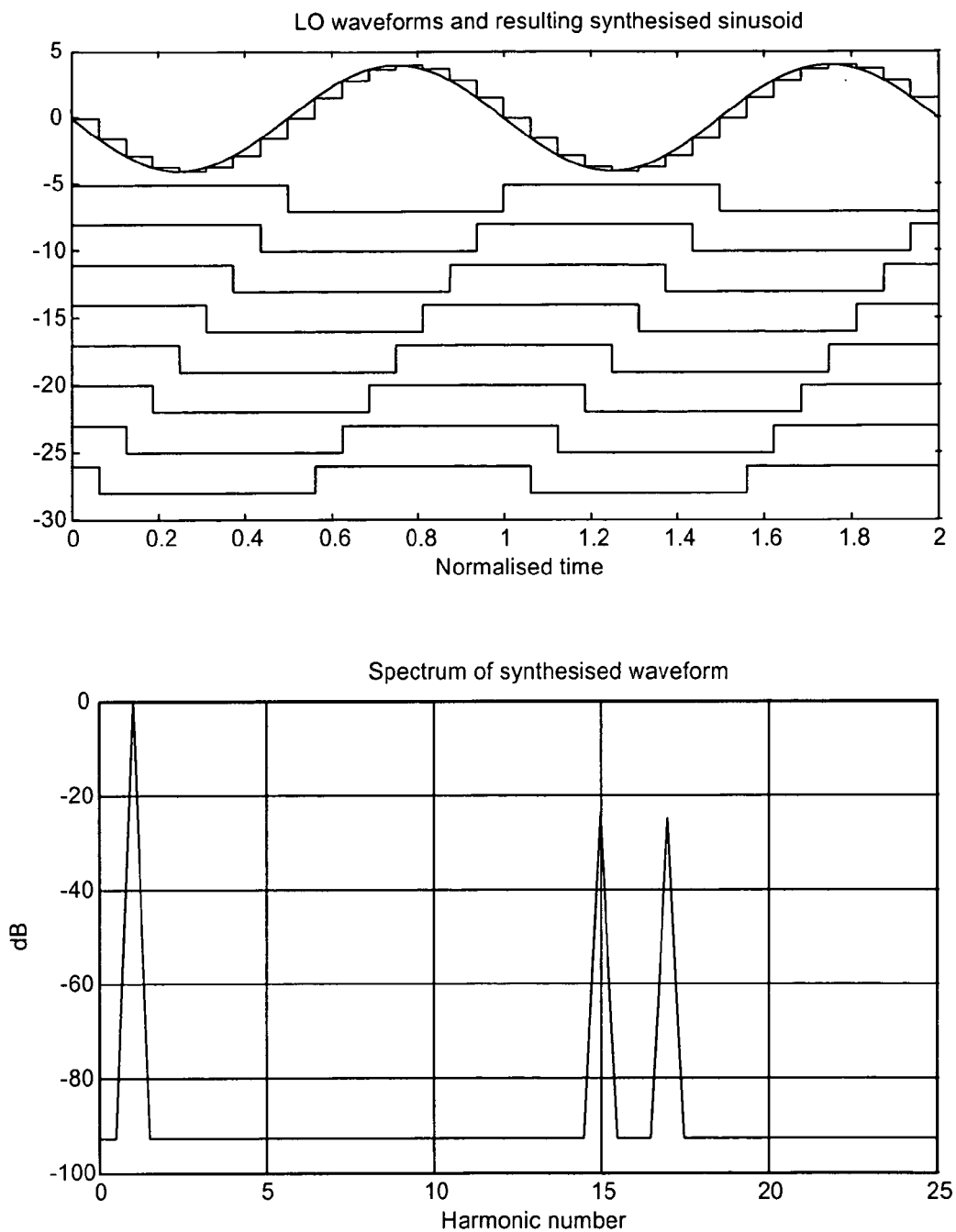
FIG. 6 shows an example of waveforms output from the multi-phase LO generator of the present invention.

FIG. 6 shows an example of waveforms output from the multi-phase LO generator of the present invention. Each LO waveform is identical in shape and output with a different phase from the outputs of the flip-flops in the shift register. The pattern generator determines the shape of the waveforms and the reclocking signal determines the phase difference, or delay, between each LO signal. The staggered-phase LO waveforms drive a multi-mixer tuner, where each mixer can apply a different weighting to the RF input signal to result in a stepped synthesized sinusoidal waveform as the effective local oscillator signal for the mixer. The clock harmonics of the effective LO signal are far above the fundemental of the sinusoid as shown in the spectrum plot. Images of the tuned RF signal produced by the high harmonic frequencies can be filtered out leaving only the desired signal produced by the first harmonic, or fundamental, frequency of the sinusoid.

What is claimed is:

1. A phase-accurate multi-phase wide-band radio frequency local oscillator (LO) generator for generating a plurality of LO signals comprising:
   a shift register comprising a plurality of flip-flops each with a data input, LO signal output, a coupling output, and clock input, the coupling outputs of the flip-flops connected in series and each flip-flop clock input driven by a common clock signal, the first flip-flop data input connected to a pattern signal;
   each flip-flop comprising a first slave stage, a master stage, and a second slave stage connected in series; wherein the slave stages and the master stage are driven by opposite edges of the clock input signal and the second slave stage drives the LO signal output;
   wherein each flip-flop outputs an LO signal from the second slave stage to drive a mixer and the master stage of each flip-flop drives the coupling output to a next flip-flop in the series connection.

2. The local oscillator generator of claim 1 further comprising:
   a pattern generator that divides an input clock signal to create a pattern signal and a reclocking signal, the frequency of the pattern signal determines a selecting frequency for the tuner and the reclocking signal determines the phase of the LO signals, the pattern signal driving the first flip-flop of the shift register and the reclocking signal driving the common clock signal.

3. A local oscillator (LO) generator comprising:
   means for producing an LO pattern signal;
   means for producing a reclocking signal;
   shift register means for producing a plurality of LO signals with a common pattern determined by the LO pattern signal and staggered phase determined by the reclocking signal,
   wherein the shift register means comprises flip-flops with a slave-master-slave configuration wherein the LO signals are output from the second slave and the shift register is formed by series connection from the master output of each flip-flop to the first slave of the next flip-flop in series,
   whereby a plurality of LO signals are generated for use with a multi-mixer tuner.

4. A radio frequency local oscillator generator for driving a bank of mixers comprising:
   a shift register comprising a plurality of flip-flops connected in series and each flip-flop driven by a common clock signal;
   each flip-flop comprising a first slave stage, a master stage, and a second slave stage; wherein the slave stages and the master stage are driven by opposite edges of the clock signal;
   wherein each flip-flop outputs a local oscillator (LO) signal from the second slave stage to drive a mixer; each flip-flop further drives a next flip-flop in the series connection; the next flip-flop connection is output from the master stage.

* * * * *